United States Patent [19]

Nakamura et al.

[11] Patent Number: 4,973,849
[45] Date of Patent: Nov. 27, 1990

[54] ELECTRON BEAM LITHOGRAPHY APPARATUS HAVING EXTERNAL MAGNETIC FIELD CORRECTING DEVICE

[75] Inventors: Kazumitsu Nakamura, Katsuta; Yukio Yoshinari, Toukai, both of Japan

[73] Assignee: Hitachi, Ltd., Tokyo, Japan

[21] Appl. No.: 406,539

[22] Filed: Sep. 13, 1989

[30] Foreign Application Priority Data

Sep. 20, 1988 [JP] Japan ................. 63-235282

[51] Int. Cl.⁵ .............................................. G21K 5/10
[52] U.S. Cl. ............................ 250/492.2; 250/492.3; 250/396 R; 250/396 ML
[58] Field of Search ............. 250/492.22, 492.2, 492.3, 250/492.23, 396 R, 396 ML, 397, 398

[56] References Cited

U.S. PATENT DOCUMENTS

| | | |
|---|---|---|
| 3,699,304 | 10/1972 | Baldwin, Jr. et al. ......... 250/492.22 |
| 3,984,687 | 10/1976 | Loeffler et al. ............. 250/396 ML |
| 4,084,095 | 4/1978 | Wolfe ................. 250/492.2 |
| 4,119,854 | 10/1978 | Tanaka et al. .................. 250/492.22 |
| 4,151,422 | 4/1979 | Goto et al. ........................ 250/492.3 |
| 4,362,942 | 12/1982 | Yasuda ....................... 250/492.22 |
| 4,396,901 | 8/1983 | Saitou et al. ..................... 250/492.2 |
| 4,647,782 | 3/1987 | Wada et al. ................... 250/492.22 |
| 4,661,712 | 4/1987 | Mobley .............................. 250/398 |
| 4,701,623 | 10/1987 | Beasley ............................ 250/492.2 |
| 4,806,766 | 2/1989 | Chisholm ................... 250/396 ML |
| 4,845,370 | 7/1989 | Thompson et al. ................. 250/397 |

Primary Examiner—Jack I. Berman
Assistant Examiner—Kiet T. Nguyen
Attorney, Agent, or Firm—Antonelli, Terry, Stout & Kraus

[57] ABSTRACT

An electron beam lithography apparatus having an external magnetic field correcting device comprises an electron gun for irradiating an electron beam onto a semiconductor wafer, a electron beam column made from a high magnetic permeability material disposed around the electron beam, a coil equipped on the electron beam column, a magnetic sensor for detecting an external magnetic field which is disposed at the outside of the electron beam column, a stage for mounting and moving the semiconductor wafer, a position detecting means for detecting the position mark on the stage, a correcting device for generating a correcting signal based on the outputs from the magnetic sensor and the position detecting means, and a current adjusting device for adjusting a correcting current flown into the coil according to the correcting signal from the correcting device so as to compensate a rotational deviation of the electron beam caused by the external magnetic field. The electron beam lithography apparatus is obtained at a low cost and results in high positioning accuracy without requiring a covering of a high magnetic permeability material around the electron beam lithography apparatus.

7 Claims, 2 Drawing Sheets

ELECTRON BEAM LITHOGRAPHY APPARATUS HAVING EXTERNAL MAGNETIC FIELD CORRECTING DEVICE

BACKGROUND OF THE INVENTION

The present invention relates to an electron beam lithography apparatus and more particularly to an electron beam lithography apparatus having an external magnetic field correcting device for correcting the rotational effect to an electron beam caused by the external magnetic field around the electron beam lithography apparatus.

The electron beam lithography apparatus is generally used for processing a semiconductor wafer. Recently, the integration capacity of the semiconductor device has become higher, and processing line width less than 0.5 $\mu$m is needed. In this case, the positioning accuracy for positioning the electron beam in order to trace a lithographic pattern on the semiconductor wafer is needed to be less than 0.1 $\mu$m. But it becomes impossible to keep the positioning accuracy less than 0.1 $\mu$m, when the variation of the external magnetic field around the electron beam lithography apparatus is more than 5 mG.

In order to keep a high positioning accuracy, the electron beam lithography apparatus is covered with a high magnetic permeability material or is installed in a room covered by a high magnetic permeability material in order to shield the external magnetic field from the electron beam apparatus.

Further, in other prior art, the variation of the external magnetic field is detected so as to cancel it.

The Japanese Pat. Laid-open Nos. 52-136578 (1977) and 59-146144 (1984) are cited as examples of such systems.

But these conventional techniques have a problem of higher cost and it is difficult to perfectly cancel the variation of the external magnetic field.

SUMMARY OF THE INVENTION

The present invention has been designed to overcome the above mentioned problem of the conventional technique.

An object of present invention is to provide a simple and low cost electron beam lithography apparatus having an external magnetic field correcting device for correcting the rotational effect on an electron beam caused by the external magnetic field around the electron beam lithography apparatus.

In the electron beam lithography apparatus having an electron beam column through which an electron beam is irradiated onto a semiconductor wafer, the electron beam lithography apparatus in the present invention has a magnetic sensor which detects the external magnetic field around the electron beam lithography apparatus, a coil installed on the electron beam column and a electric current control device which causes an electric current to flow into the coil according to the external magnetic field detected by the sensor so as to correct the rotational effect on an electron beam caused by the external magnetic field around the electron beam lithography apparatus.

DETAILED DESCRIPTION OF THE PREFERRED EMBODIMENTS

Figure 4:
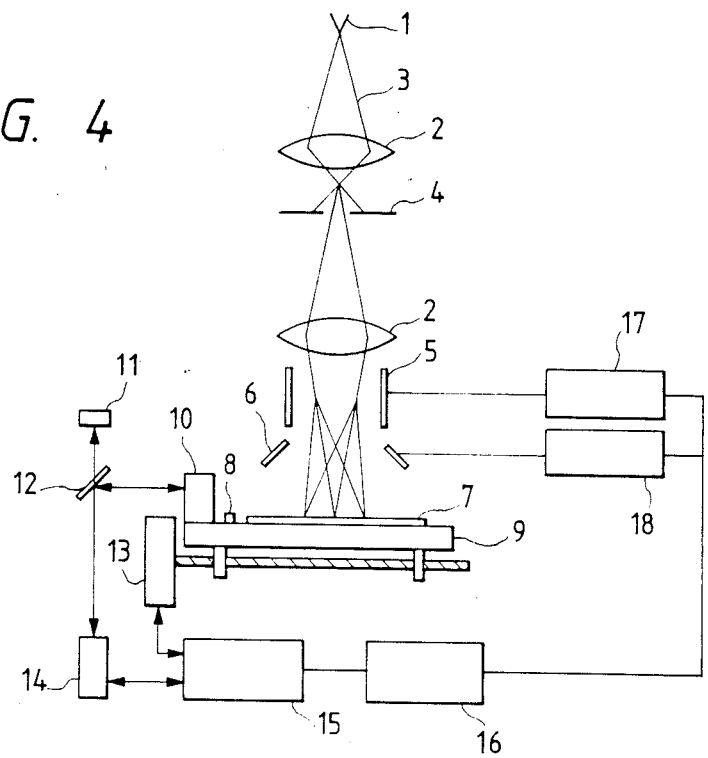
FIG. 4 is a diagrammatic view showing an electron beam lithography apparatus applied the present invention.

FIG. 4 is a diagrammatic view showing an electron beam lithography apparatus which is applied the present invention. An electron beam 3 irradiated from an electron gun 1 is controlled to have a certain current density and shape by an aperture 4 and lenses 2. The electron beam 3 is converged onto the surface of a semiconductor wafer 7 set on a stage 9 which is moved by a servo-motor 13. The stage 9 is controlled by a stage controller which responds to a desired position signal from a computer 16 and a real position detected by the laser length measuring equipment 14. A position mark detector 18 detects the position mark 8 based on the signal from the secondary electron detector 6 which detects secondary electrons reflected from the semiconductor wafer 7. The electron beam 3 is deflected by a deflector 5 which is controlled by a deflection controller 17 so as to scan on the surface of the semiconductor wafer 7. Numeral 10 denotes a mirror for measuring the position of the stage 9, numeral 11 denotes a reference mirror and numeral 12 denotes a half-mirror.

A electron beam column comprises electron lenses 2, the deflector 5 through which the electron beam is irradiated from the electron gun 1 onto the surface of the semiconductor wafer 7 is constructed with a high magnetic permeability material such as permalloy or ferrite. When the external magnetic field is added to the electron beam column, the magnetic field characteristics of the magnetic field column is varied and the position at which the electron beam converges is changed so as to be rotated as shown in FIG. 3.

Figure 2:
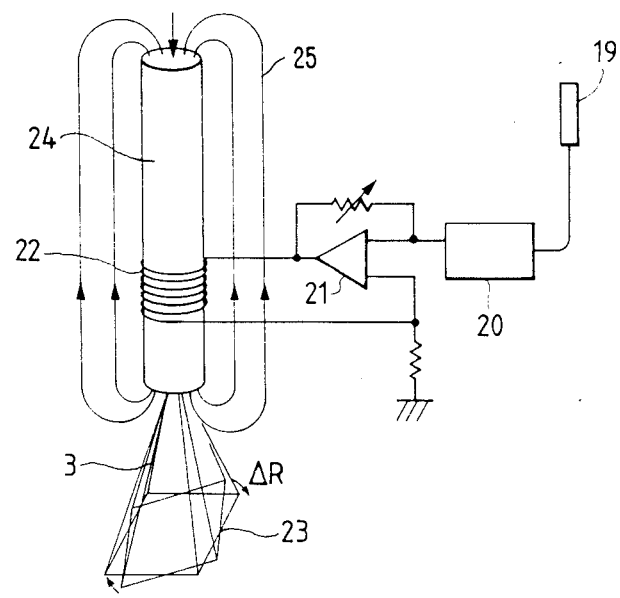
FIG. 2 is a diagrammatic view of a rotational correction system of an electron beam path in an embodiment of the present invention.
Figure 3:
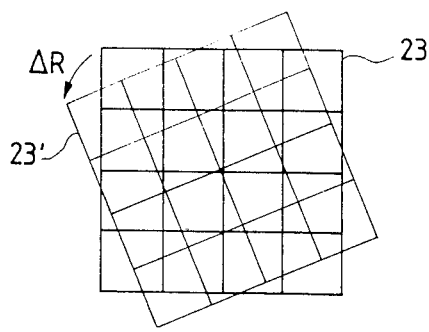
FIG. 3 is a diagrammatic view showing a deviation of an electron beam path swept out by the electron beam irradiated onto the wafer in the present invention.

FIG. 3 shows a positional deviation of an electron beam path pattern 23 in the rotational direction. The electron beam is deflected by the deflector 5 and traces the electron beam path pattern 23 having a lattice shape on the surface of the semiconductor wafer 7. But owing to the external magnetic field, the electron beam is rotated from the path pattern 23 to a rotated path pattern 23'. When the electron beam traces the lattice path patterns, lines of magnetic force are generated by the electron beam column and pass therethrough from outside to inside in a closed loop so as to effect a magnetic force on the electron beam based on Fleming's left hand rule. The lines of magnetic force are denoted as 25 in FIG. 2 the effect of the external magnetic field is detected by the magnetic sensor 19.

Figure 5:
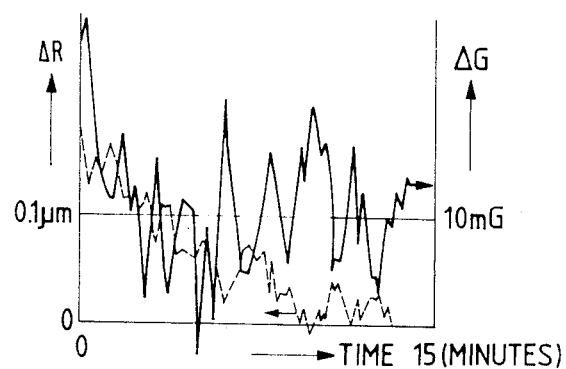
FIG. 5 is a diagrammatic view showing a deviation data of the electron beam caused by the variation of the external magnetic field detected by the magnetic sensor in the present invention.

FIG. 5, is a diagrammatic view showing a deviation $\Delta R$ of the electron beam path in the rotational direction caused by the variation $\Delta G$ of the external magnetic field detected by the magnetic sensor in the present invention.

In FIG. 5, a continuous line denotes the variation $\Delta G$ and a dotted line denotes the deviation $\Delta R$. The deviation $\Delta R$ of the electron beam path in the rotational direction is measured by detecting the position mark 8 on the stage 9. The deviation $\Delta R$ corresponding to the variation $\Delta G$ of the external magnetic field depends on the energy of the electron beam or a shape of the electron beam column, and in some data was obtained data showing that the deviation $\Delta R$ is 0.1 $\mu$m when the variation $\Delta G$ of the external magnetic field is 10 mG as shown in FIG. 5.

Figure 1:
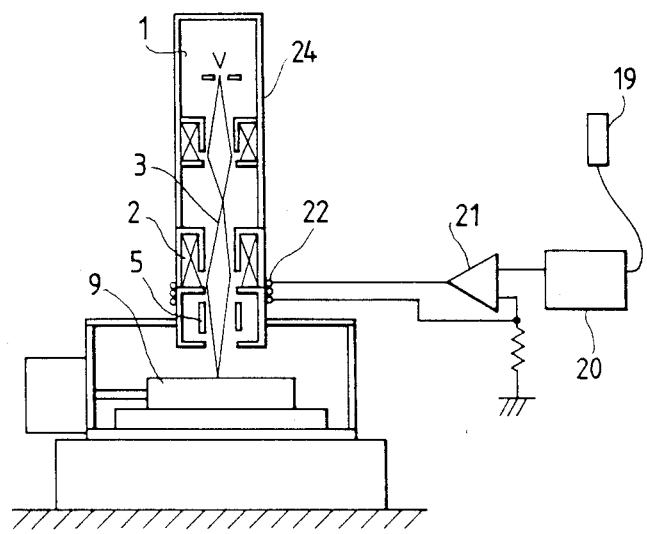
FIG. 1 is a diagrammatic cross-sectional view of an embodiment in the present invention.

FIG. 1 is a diagrammatic cross-sectional view of an embodiment in the present invention which compensates for the deviation $\Delta R$ corresponding to the variation $\Delta G$ of the external magnetic field stated above.

A magnetic sensor 19 is disposed apart from the electron beam lithography apparatus so as to detect a magnetic field around the electron beam lithography apparatus and is connected to an external magnetic field correcting device 20. The external magnetic field correcting device 20 is connected to a current adjusting device 21 and outputs a control signal to the current adjusting device 21 depending upon the external magnetic field detected by the sensor 19. The current adjusting device 21 outputs an adjusting current supplied to a correction coil 22 so as to cancel the deviation $\Delta R$ of the electron beam path traced by the variation $\Delta G$ of the external magnetic field.

Furthermore, we will explain how to obtain and cancel the deviation $\Delta R$ in detail.

The electron beam lithography apparatus has the position mark 8 on the stage 9 and a laser length measuring equipment 14 as shown in FIG. 4. The position mark 8 on the stage 9 is moved on so as to trace the lattice patterns with accuracy less than 0.01 $\mu$m as shown in FIG. 3. While the position mark 8 is moved, the electron beam scans the position mark 8 and the real position R of the position mark 8 is detected by the position mark detector 18 based on the output from the secondary electron detector 6 which detects secondary electrons reflected from the wafer 7.

At first, magnetic sensor 19 detects the external magnetic field $G_1$, and at the same time, the position mark detector 18 detects the position $R_1$ of the position mark 8 which is moved to trace the path pattern 23 based on the output from the secondary electron detector 6.

A few minutes later, magnetic sensor 19 detects the external magnetic field $G_2$ which is varied from the external magnetic field $G_1$, and at the same time, the position mark detector 18 detects the position $R_2$ of the position mark 8 which is moved to trace the path pattern 23' in the same way as above. Then, the relation of the positional deviation $\Delta R$ of electron beam path corresponding to the variation $\Delta G$ of the external magnetic field is obtained from the difference between $R_1$ and $R_2$ corresponding to the difference between $G_1$ and $G_2$ using computer 16 in FIG. 4.

On the other side, the external magnetic field correcting device 20 responds to a signal $\Delta G$ which is equal to the difference between $G_1$ and $G_2$ detected by the magnetic sensor 19 and the gain of the current adjusting device 21 which outputs the adjusting current to the correction coil 22 or the external magnetic field correcting device 20 is adjusted so as to correspond the positional deviation of electron beam path in the reverse rotational direction to the value $\Delta R$.

In this way, the gain of the current adjusting device 21 is adjusted to compensate for the deviation $\Delta R$ of the electron beam in the rotational direction caused by the variation of the external magnetic field. Furthermore, the gain of the external magnetic field correcting device 20 may be adjusted in the same way as above instead of the gain of the current adjusting device 21.

We claim:

1. An electron beam lithography apparatus including an external magnetic field correcting device comprising:
    an electron gun for irradiating an electron beam onto a wafer;
    an electron beam column made from a high magnetic permeability material disposed around the electron beam;
    a coil disposed on the electron beam column;
    a magnetic sensor for detecting an external magnetic field disposed outside of the electron beam column;
    a stage for mounting and moving the wafer;
    position detecting means for detecting a position mark disposed on the stage;
    a correcting device for generating a correcting signal based on the outputs from the magnetic sensor and the position detecting means; and
    a current adjusting device for adjusting a correcting current flowing in the coil according to the correcting signal from the correcting device so as to compensate for a rotational deviation of the electron beam caused by the external magnetic field.

2. An electron beam lithography apparatus according to claim 1, wherein:
    said correcting device generates the correcting signal by measuring the rotational deviation of the electron beam corresponding to a variation of the external magnetic field detected by the magnetic sensor.

3. A electron beam lithography apparatus according to claim 1, wherein;
    said correcting device generates the correcting signal by measuring the rotational deviation of the electron beam using the position detecting means at the same time a variation of the external magnetic field is detected by the magnetic sensor.

4. An electron beam lithography apparatus according to claim 1, wherein:
    a gain of the correcting device is adjusted so as to correspond to the rotational deviation of the electron beam caused by the variation of the external magnetic field in response to the detection of the external magnetic field by the magnetic sensor.

5. An electron beam lithography apparatus according to claim 1, wherein:
    a gain of the current adjusting device is adjusted so as to correspond to the rotational deviation of the electron beam caused by the variation of the external magnetic field in response to the detection of the external magnetic field by the magnetic sensor.

6. A electron beam lithography apparatus according to claim 1, wherein;
    said coil is wound around the electron beam column.

7. An electron beam lithography apparatus according to claim 1, wherein:
    said position detecting means determines a position of the stage by detecting a position mark on the stage.

* * * * *